United States Patent
Petropoulos et al.

[11] Patent Number: 6,100,692
[45] Date of Patent: Aug. 8, 2000

[54] GRADIENT COIL SET WITH A FINITE SHIELD CURRENT

[75] Inventors: Labros S. Petropoulos, Solon; Junxiao Ling, University Heights, both of Ohio

[73] Assignee: Picker International, Inc., Highland Heights, Ohio

[21] Appl. No.: 09/003,720

[22] Filed: Jan. 5, 1998

[51] Int. Cl.$^7$ .................................................. G01V 3/00
[52] U.S. Cl. ...................................... 324/318; 324/309
[58] Field of Search .................................. 324/318, 309, 324/322, 307, 319

[56] References Cited

U.S. PATENT DOCUMENTS

| | | |
|---|---|---|
| 4,794,338 | 12/1988 | Roemer et al. . |
| 5,132,618 | 7/1992 | Sugimoto . |
| 5,296,810 | 3/1994 | Morich . |
| 5,481,191 | 1/1996 | Rzedzian ................................ 342/318 |
| 5,488,299 | 1/1996 | Kondo et al. .......................... 324/318 |

*Primary Examiner*—Christine K. Oda
*Assistant Examiner*—Brij B. Shrivastav

*Attorney, Agent, or Firm*—Fay, Sharpe, Fagan, Minnich & McKee, LLP

[57] ABSTRACT

A method of designing a shielded gradient coil assemblies (22) for magnetic resonance imaging systems is provided. The method includes generating a first continuous current distribution for a primary coil (60) using an inverse approach. The first continuous current distribution is confined within predetermined finite geometric boundaries of a surface defined by two dimensions and generates a magnetic gradient field across an imaging region (14). The magnetic gradient field constrained to predetermined values at specified spatial locations within the imaging region (14). The current distribution and magnetic field are converted into a stored energy and magnetic field domain where a finite element analysis is performed to generate a second continuous current distribution for a shielding coil (62). The second continuous current distribution is confined within predetermined finite geometric boundaries of a surface surrounding the primary coil (60). The second continuous current distribution generates a magnetic field which substantially cancels in an area outside a region defined by the shielding coil a fringe magnetic field generated by the first continuous current density.

16 Claims, 8 Drawing Sheets

GRADIENT COIL SET WITH A FINITE SHIELD CURRENT

BACKGROUND OF THE INVENTION

The present invention relates to the magnetic resonance arts. It finds particular application in conjunction with gradient coils for magnetic resonance imaging apparatus and will be described with particular reference thereto. However, it is to be appreciated that the present invention also finds application in conjunction with other applications which generate gradient magnetic fields.

In a magnetic resonance imaging system, gradient coil assemblies are commonly pulsed with electrical current pulses to produce magnetic gradients across the main magnetic field in the vicinity of an imaging region. The magnetic field gradients interact with external metallic structures such as the magnet cold shields, the magnet dewar, and the like. The interaction generates eddy currents in the effected structures. These eddy currents, in turn, generate eddy magnetic fields which have a deleterious effect on the temporal and spatial quality of the magnetic field in the vicinity of the imaging region and, hence, in the resultant image quality.

The eddy current problem is often addressed by placing an active shielding coil between the primary gradient coil and the effected structure. The shielding coils are designed to substantially zero or cancel the magnetic field external to itself thereby preventing the formation of eddy currents in potentially vulnerable structures.

Previously methods for production for magnetic gradients in magnetic resonance imaging systems consisted of winding discrete coils in a bunched or distributed fashion on an electrically insulating hollow cylindrical former and driving the coils with a current source of limited voltage. Conventional bunched coil designs include the Maxwell and the Modified Maxwell Pair for z-gradient production, and the Golay or Modified Golay (multi-arc) Saddle Coils for x and/or y-gradient production. Typically, these methods consisted of iteratively placing coil loops or arcs on the cylindrical former until the desired gradient strength, gradient uniformity, and inductance (related to stored energy) were achieved. These previous designs were generally developed in a "forward approach" whereby a set of initial coil positions were defined (i.e., the initial coil distribution), the fields and the inductance/energy calculated, and if not within particular design parameters, the coil positions would be shifted (statistically or otherwise) and results re-evaluated. The iterative procedure continued until a suitable design was obtained.

More recent methods of generating magnetic fields in magnetic resonance imaging systems utilize an "inverse approach." In the "inverse approach" method, the gradient magnetic field is forced to match predetermined values at specified spatial locations inside the imaging volume and a continuous current density is calculated which is capable of producing such a field. The "inverse approach" method assumes that the primary gradient coil has finite dimensions while those of the secondary or shield coil are left unrestricted (infinite). After the generation of continuous current distributions for both the primary and the shield coils, an apodization algorithm is performed on the continuous current density of the shield coil in order to restrain it to desirable dimensions. Following the modification of the shielding coil's continuous current, the Stream Function technique is employed in order to obtain discrete current patterns for both coils. Application of the Biot-Savart law to the discrete current pattern ensures that the discretization procedure was proper. This approach created generally more energy efficient gradient coil assemblies with higher gradient strengths and faster slew rates as compared to the "forward approach" method.

One particular prior art approach is discussed in U.S. Pat. No. 4,794,338 to Roemer, et al. The approach of designing a shielded gradient coil assembly introduced by Roemer, et al. is based on the "forward approach" method. The outcome is a shielded gradient coil assembly with a moderate to low efficiency rate in terms of gradient strength and slew rate. Further, there is no precondition to the method for controlling eddy current effects inside the imaging region.

Another particular prior art gradient coil assembly is described in U.S. Pat. No. 5,296,810 to Morich. Morich describes a cylindrically shaped shielded gradient coil assembly for magnetic resonance applications. Morich uses the "inverse approach" method of designing gradient coil assemblies where the primary coil has a finite length while the length of the shielding coil is considered infinite. This configuration generates coils with high gradient strengths and slew rates while at the same time reduces the eddy current effects when the length of the shield coil is substantially longer (20% or more) than the length of the primary coil. In order to restrain the current of the shielding coil within desired dimensional boundaries, apodization techniques (e.g., guassian apodization) are employed. In this manner, the overall length of the shielding coil is approximately 20% longer than the total length of the primary gradient coil. Since the shielding coil was modeled as having an infinite length, in order to confine the length of the shielding coil to finite dimensions, current truncation is necessary. The current apodization process towards the ends of the shielding coil cause disturbances in the shielding field and ultimately result in unwanted eddy current effects inside the imaging region. These effects become more deleterious as the length of the shielding coil approaches the length of the primary coil.

In another particular prior art shielded gradient coil assembly described in U.S. Pat. No. 5,132,618 to Sugimoto, the design is based on the "inverse approach" method. In this design, both the primary and the shielded coil lengths were assumed infinite and continuous current densities for both the primary and the secondary coil are modeled based on this assumption. In order to restrain the current densities on both the primary and secondary coils, truncation is again employed. Although the outcome of this method is similar to that of the Morich patent discussed earlier, the additional truncation of the primary coil's current in this case introduces increased levels of eddy current effects inside the imaging region.

For interventional procedures and like applications where patient access is desirable, it is advantageous to design the gradient shielding coil such that its dimensions do not exceed those of the primary gradient coil. In this manner, patient access can be maximized and the feeling of openness can reduce patient claustrophobia. However, in general, the previous methods and prior art discussed above suffer the drawback that as the shielding coil length approaches that of the primary coil, increased levels of eddy current effects within the imaging region deteriorate image quality. Conversely, when sufficient shielding is achieved, the dimensions of the shielding coil are sufficiently larger than those of the primary coil that the level of patient access is encumbered and an increased level of patient claustrophobia is experienced.

The present invention contemplates a new and improved shielded gradient coil assembly and method for designing such which overcomes the above-referenced problems and others.

SUMMARY OF THE INVENTION

In accordance with one aspect of the present invention, a method of designing shielded gradient coil assemblies for magnetic resonance imaging systems is provided. The method includes generating a first continuous current distribution for a primary coil using an inverse approach. The first continuous current distribution is confined within predetermined finite geometric boundaries of a surface defined by two dimensions and generates a magnetic gradient field across an imaging region. The magnetic gradient field is constrained to predetermined values at specified spatial locations within the imaging region. Thereafter, a second continuous current distribution for a shielding coil is generated using finite element analysis. The second continuous current distribution is confined within predetermined finite geometric boundaries of a surface surrounding the primary coil. The second continuous current distribution generates a magnetic field which substantially cancels in an area outside a region defined by the shielding coil a fringe magnetic field generated by the first continuous current density.

In accordance with a more limited aspect of the present invention, the primary coil is cylindrical and the two dimensions that define it are axial position along a length of the cylinder and annular rotation about a circumference of the cylinder.

In accordance with a more limited aspect of the present invention, the shielding coil is cylindrical and has a length substantially equal to or less than that of the primary coil.

In accordance with a more limited aspect of the present invention, the shielding coil is made of a conductive material and a harmonic analysis at high frequency is performed to obtain the second continuous current distribution.

In accordance with a more limited aspect of the present invention, the method further includes discretizing the first continuous current distribution to obtain a discrete current pattern, and applying the Biot-Savart law to the discrete current pattern to verify its validity.

In accordance with a more limited aspect of the present invention, a maximum of the fringe magnetic field in the area outside the region defined by the shielding coil is less than 50 $\mu$T.

In accordance with another aspect of the present invention, a method of designing a shielded gradient coil assembly having an inner, primary cylindrical winding and an outer, shield cylindrical winding both of finite length is provided. The method includes defining a first target magnetic field distribution within the primary cylindrical winding. A first continuous current distribution is generated for lying on a cylinder having a length and diameter of the primary cylindrical winding. A finite element analysis is performed using as a load the first continuous current distribution of the primary cylindrical winding and via eddy current analysis a second continuous current distribution is obtained lying on a shield cylinder having the length and diameter of the shield cylindrical windings. The first and second continuous current distributions are discretized. Cylindrical primary and shield windings with the discretized first and second current distributions are created.

In accordance with a more limited aspect of the present invention, the first target magnetic field is a linear magnetic field gradient.

In accordance with a more limited aspect of the present invention, the primary and shield cylinders have a common length.

In accordance with a more limited aspect of the present invention, the primary and shield cylinders are circularly symmetric.

In accordance with a more limited aspect of the present invention, a shielded coil assembly designed by the method above.

In accordance with another aspect of the present invention, a magnetic resonance scanner includes a main magnet for generating a main magnetic field through an examination region. The main magnet is arranged such that its geometry defines the examination region. A couch supports a subject to be examined within the examination region. A radio frequency coil is disposed adjacent the examination region for transmitting radio frequency signals into the examination region and selectively exciting dipoles disposed therein. A radio frequency transmitter drives the radio frequency coil. A receiver receives magnetic resonance signals from resonating dipoles within the examination region. An image processor reconstructs an image representation from the received magnetic resonance signals for display on a human readable display. The scanner also includes a gradient coil assembly for generating substantially linear magnetic gradients across the main magnetic field. The gradient coil assembly includes at least one primary coil assembly disposed about the examination region including an array of conductive coil loops arranged on a finite former such that a current density flowing thereon generates the substantially linear magnetic gradients. The gradient coil assembly also includes at least one secondary coil assembly disposed about the primary coil assembly between the primary coil assembly and the main magnet including an array of conductive coil loops arranged on a finite former such that a current density flowing thereon substantially cancels magnet flux density outside an area defined by the secondary coil assembly. The current density of the secondary coil assembly is arranged to counter eddy currents that would be generated in the secondary coil assembly by the primary coil assembly.

In accordance with a more limited aspect of the present invention, the formers are hollow cylindrical tubes arranged such that the examination region is defined inside the former of the primary coil assembly with the former of the primary coil assembly positioned inside the former of the secondary coil assembly. The axial length of the secondary coil assembly is substantially equal to or less than that of the primary coil assembly.

In accordance with a more limited aspect of the present invention, a maximum magnetic flux density outside the area defined by the secondary coil assembly is less than 50 $\mu$T.

In accordance with a more limited aspect of the present invention, the current density at axial ends of the cylindrical secondary coil assembly is greater than at its center.

In accordance with a more limited aspect of the present invention, the gradient coil assembly includes three primary coil assembly and secondary coil assembly pairs for generating substantially linear magnetic gradients along three mutually orthogonal axes.

One advantage of the present invention resides in the ability to designing shielded gradient coil assemblies for short magnet geometries which improve patient access and reduce patient claustrophobia.

Another advantage of the present invention resides in reducing eddy current effects in the vicinity of the imaging region.

Another advantage of the present invention resides in producing substantially linear magnetic gradients with relatively high strengths and increased slew rates.

Another advantage of the present invention resides in generating current patterns for a finite shielding coil without the use of current truncation or apodization mechanisms.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
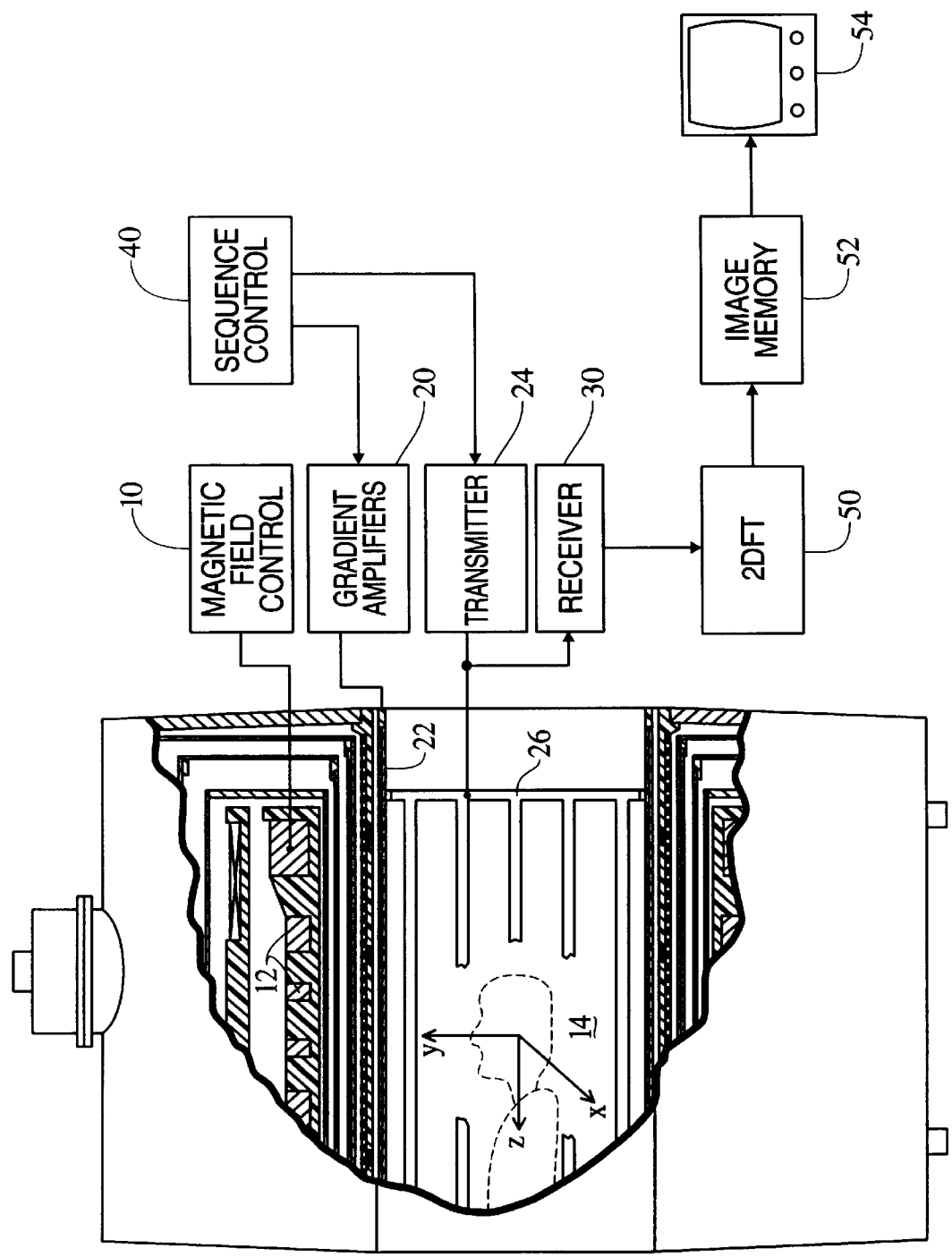
FIG. 1 is a diagrammatic illustration of a magnetic resonance imaging apparatus including a shielded gradient coil assembly designed in accordance with the present invention.

With reference to FIG. 1, a main magnetic field control 10 controls superconducting or resistive magnets 12 such that a substantially uniform, temporally constant main magnetic field is created along a z axis through an examination region 14. A couch (not illustrated) suspends a subject to be examined within the examination region 14. A magnetic resonance echo means applies a series of radio frequencies (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectrography sequences. More specifically, gradient pulse amplifiers 20 apply current pulse to selected ones or pairs of gradient coil assemblies 22 to create magnetic field gradients along x, y, and z axes of the examination region 14. A digital radio frequency transmitter 24 transmit radio frequency pulses or pulse packets to a whole-body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. For whole-body applications, the resonance signals are commonly picked up by the whole-body RF coil 26.

For generating images of local regions of the subject, specialized radio frequency coils are placed continuous to the selected region. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals introduced by whole-body coil RF transmissions. The resultant radio frequency signals are picked up by the whole-body RF coil 26, the insertable RF coil, or other specialized RF coils and demodulated by a receiver 30, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. For the selected sequence, the receiver 30 receives a plurality of data lines in rapid succession following each RF excitation pulse. Ultimately, the radio frequency signals received are demodulated and reconstructed into an image representation by a reconstruction processor 50 which applies a two dimensional Fourier transform or other appropriate reconstruction algorithm. The image may represent a planar slice through the patient, an array of parallel planar slices, a three dimensional volume, of the like. The image is then stored in an image memory 52 where it may be accessed by a display, such as a video monitor 54 which provides a human readable display of the resultant image.

Heretofore, the conventional design for shielded gradient coil assemblies has generally been based upon the assumption that the total length of the shielding coil is unrestricted and thus its current density is assumed as infinitely extended. Consequently, as "infinite" shielding coils are not available for practical applications, the current density was subsequently apodized or truncated to fit on appropriate finite length elements. On the other hand, the technique employed herein involves the design of a shielded gradient coil configuration whereby the current for the shielding coil is initially restricted within the boundaries of a shielding coil having a finite length.

Figure 2B:
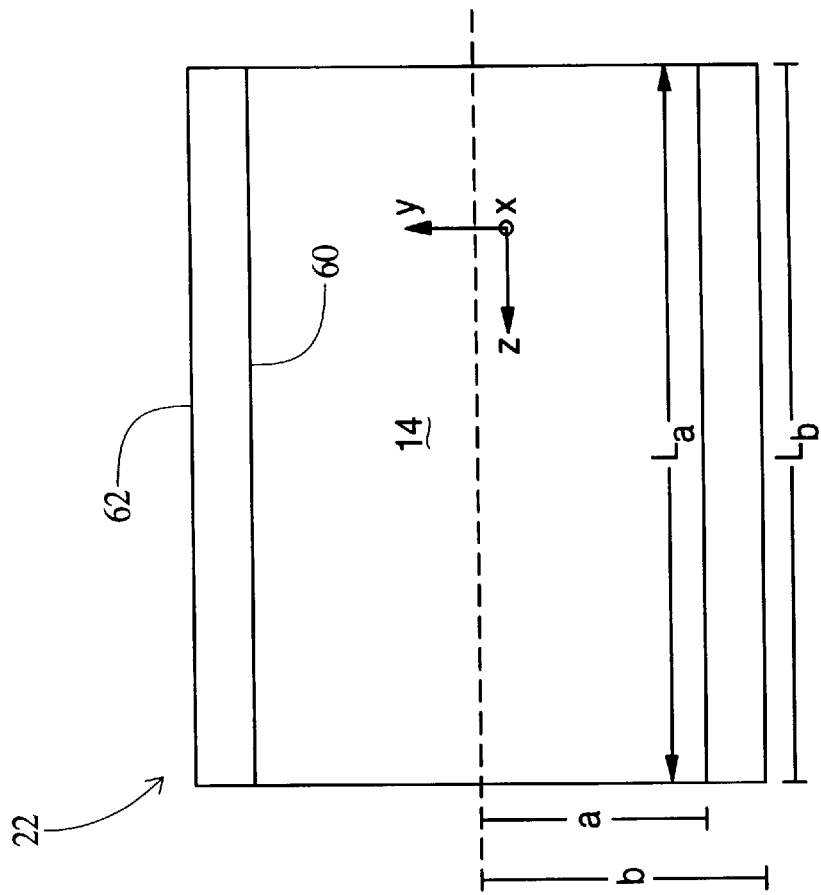
FIGS. 2A and 2B are diagrammatic illustrations of a shielded gradient coil assembly designed in accordance with the present invention.
Figure 2A:
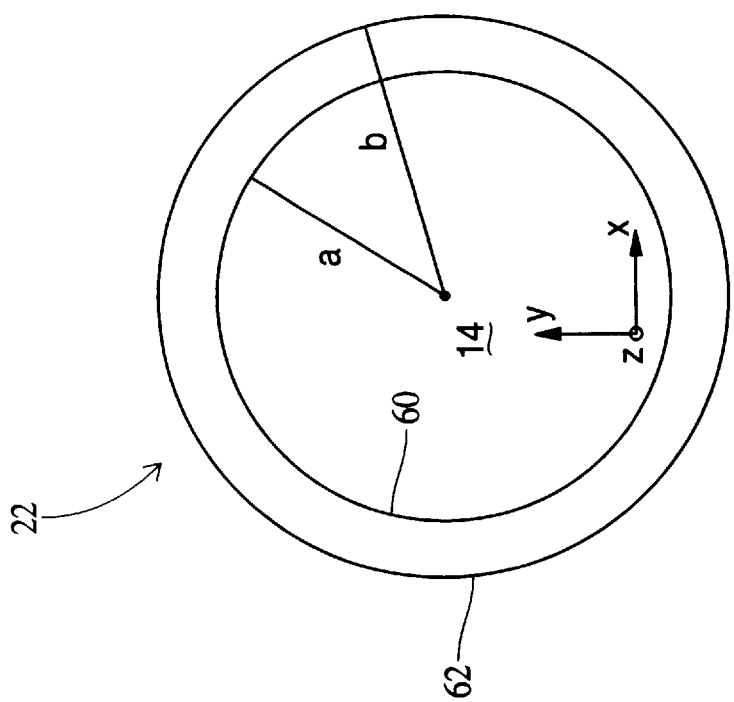

With reference to FIGS. 2A and 2B, the geometrical configuration of the shielded gradient coil assembly 22 designed such that the current density is initially contained within the finite boundaries of the shielding coil is shown. For this configuration, the total length of the primary coil 60 is denoted as $L_a$, and the length of the secondary coil 62 is denoted as $L_b$. The radius of the primary coil 60 is denoted as a while the radius of the shielding coil 62 is denoted as b.

The design of a gradient coil where the z component of the magnetic field varies substantially linearly along the x direction (a transverse gradient coil or x-gradient coil) initially involves the design of the primary coil 60 based on an inverse approach methodology. For this x-gradient coil, the gradient magnetic field is anti-symmetric in the x direction around the geometric center of the coil, while it is symmetric along the y and z directions. To generate such a gradient magnetic field, the analytical expression of the electrical current for the primary coil can be written as:

$$\vec{J}^a(\vec{r}) = [j_\phi^a(\phi, z)\hat{a}_\phi + j_z^a(\phi, z)\hat{a}_z]\delta(\rho - a), \quad (1)$$

where $\delta(\rho-a)$ is the restriction that confines the electrical current on a cylinder surface with radius a. The restriction to the primary coil length $L_a$, the confinement of the current density on the cylindrical surface, the azimuthal and axial symmetries for the $j_{\phi n}^a$ and $j_z^a$ and the demand that the current density obeys the continuity equation provides the Fourier series expansion for both components of the current density around the geometric center of the coil as follows:

$$j_\phi^a(\phi, z) = \cos\phi \sum_{n=1}^\infty j_{\phi n}^a \cos(k_n z) \quad \text{for } |z| \leq \frac{L_a}{2}, \quad (2)$$

$$j_z^a(\phi, z) = \sin\phi \sum_{n=1}^\infty \frac{j_{\phi n}^a}{k_n a} \sin(k_n z) \quad \text{for } |z| \leq \frac{L_a}{2}, \quad (3)$$

where $j_{\phi n}^a$ are the Fourier coefficients, $L_a$ represents the total length of the primary coil, and $$k_n = \frac{2n\pi}{L_a}$$

since the electrical current cannot flow off the ends of the cylinder. Furthermore, both current components are zero for $$|z| > \frac{L_a}{2}.$$

Expressing the z component of the magnetic field $B_z$ and the stored magnetic energy $W_m$ in terms of either one of the two components of the current density, the functional $\epsilon$ in terms of $W_m$ and $B_z$ is constructed as:

$$\xi(j_n^a) = W_m - \sum_{j=1}^N \lambda_j (B_z(\vec{r}_j) - B_{zSC}(\vec{r}_j)), \quad (4)$$

where $\lambda_j$ are the Lagrange multipliers and $B_{zSC}$ represent the constraint values of the z component of the magnetic field at specified N points. Minimizing $\epsilon$, a quadratic function of the current, with respect to the current coefficients $j_{\phi n}^a$ obtains a matrix equation which $j_{\phi n}^a$, satisfies:

$$\sum_{n'=1}^\infty j_{\phi n'}^a \left\{ \frac{aL_a\pi}{2} \int_{-\infty}^\infty dk\, kI_1'(ka)K_1'(ka)\psi_n(k)\psi_{n'}(k) \right\} = \quad (5)$$

$$\sum_{j=1}^N \lambda_j \cos(\phi_j) \int_{-\infty}^\infty dk\, k\cos k z_j I_1(k\rho_j)K_1'(ka),$$

where the evaluation of the Lagrange multipliers is done by way of the constraint equation. Inverting the matrix equation, a solution for $j_{\phi n}^a$, is obtained and, hence, the solution for the current density is obtained as well. Replacing this expression back into the stored energy and magnetic field formulas, a final expression for the stored magnetic energy and the magnetic field is acquired in terms of the constraint points and the geometry of the system. In this manner, the form of the continuous current distribution along the azimuthal and axial directions for the primary coil 60 is generated.

In one embodiment for the design of the primary x-gradient coil, the radius a of the cylinder is equal to 0.342138 m and its total length $L_a$ is restricted to 1.32700 m. Four Fourier coefficients were employed to specify the behavior of the current density. Furthermore, three constraint points were employed to control the field behavior inside a 45 cm imaging volume. Table 1 lists the constraint set used for designing the primary gradient coil 60.

TABLE 1

Constraint set used for the design of the primary gradient coil.
Values for ρ and z are in meters, values for $B_{zSC}$ (2n) are in T.

| n | $\rho_i$ | $z_i$ | $B_{zSC}$ (2n) |
|---|---|---|---|
| 1 | 0.001 | 0.000 | 0.000032700 |
| 2 | 0.225 | 0.000 | 0.007766000 |
| 3 | 0.001 | 0.225 | 0.000026160 |

The first constraint point defines a gradient strength for the primary coil 60 of 32.7 mT/m, the second constraint point specifies a 5% linearity of the gradient field along the gradient x-axis up to a distance of 22.5 cm (the radial distance of the 45 cm imaging volume) from the isocenter of the gradient field, and the third constraint point specifies a 20% uniformity of the gradient field inside the 45 cm imaging volume.

Through the use of these constraints and the application of the inverse approach methodology, the values are obtained for the Fourier coefficients for the current density of the primary coil 60, which determines its continuous current distribution. Next, the continuous current distribution is discretized and the Biot-Savart law is applied to the discrete current pattern in order to verify the validity of the earlier minimization.

Figure 3:
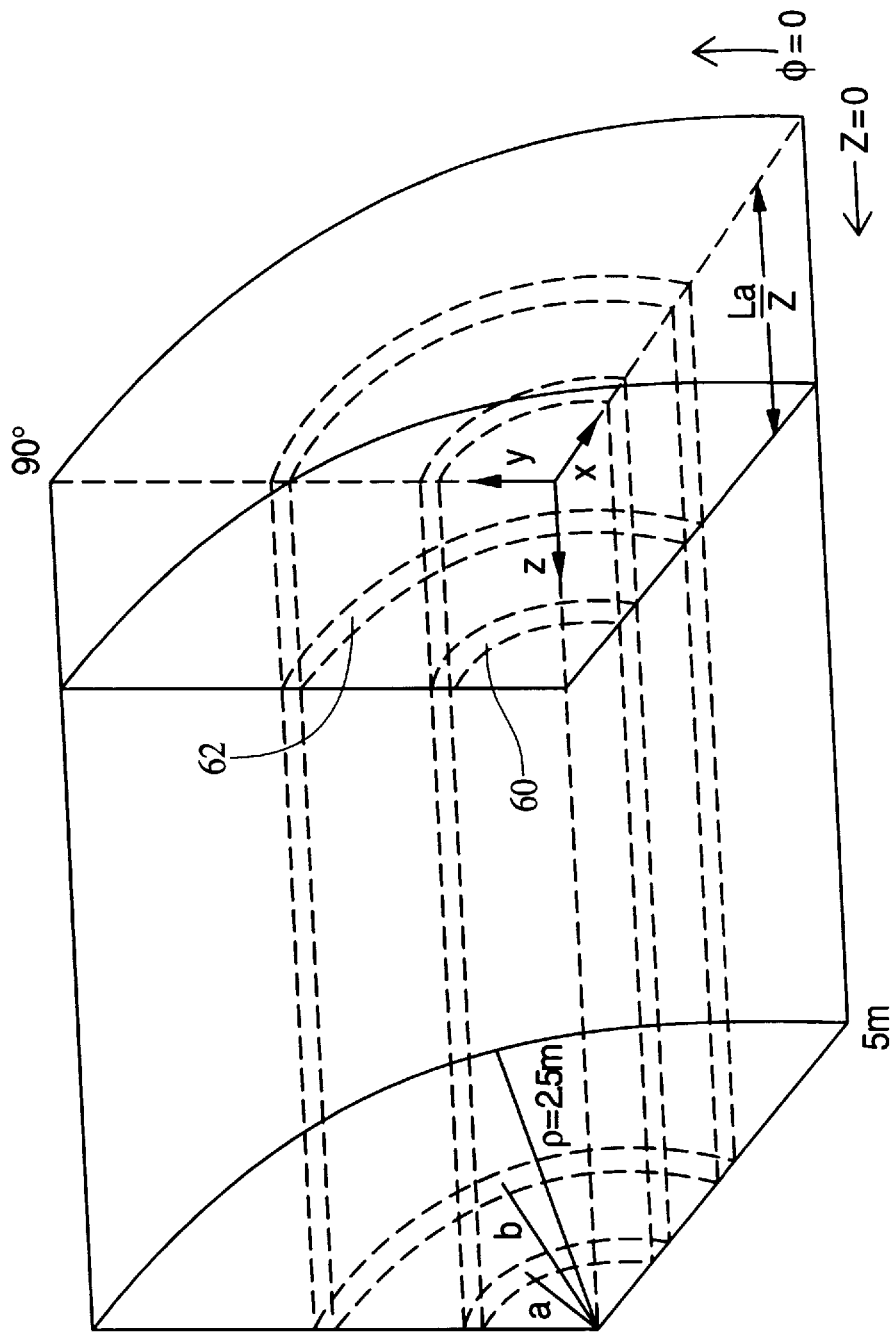
FIG. 3 is a three dimensional model of a quadrant of a shielded gradient coil assembly employed in the design thereof in accordance with the present invention.

Having developed the primary coil 60, the next step is to shield the magnetic field generated thereby with a finite length current distribution using a Finite Element Analysis. Due to symmetry conditions, only one portion needs to be modeled, with the appropriate boundary conditions that ensure correct current behavior for the primary and shielding coils. With reference to FIG. 3, a 3-D finite element model of the gradient coil assembly is illustrated. Again, due to symmetry, only one-half the axial length, z from 0 to $$\frac{L_a}{2},$$

and one quarter of the angular section, φ from 0° to 90°, is modeled. Additionally, in order to ensure the correct behavior of the magnetic field both inside and outside the gradient coil structures, the finite element model was extended axially to 5.0 m and radially to 2.5 m. At these locations, the vector potential was set to 0. The primary coil 60 is considered as a layer with an inner radius of 0.34096 m and an outer radius of 0.343320 m. This provides for a mean radius of 0.342138 m which corresponds to the radius a previously determined for the primary coil 60. Hence, the primary coil 60 has a thickness equal to 0.00236 m and a half length, $$\frac{L_a}{2},$$

of 0.6635 m.

Figure 4:
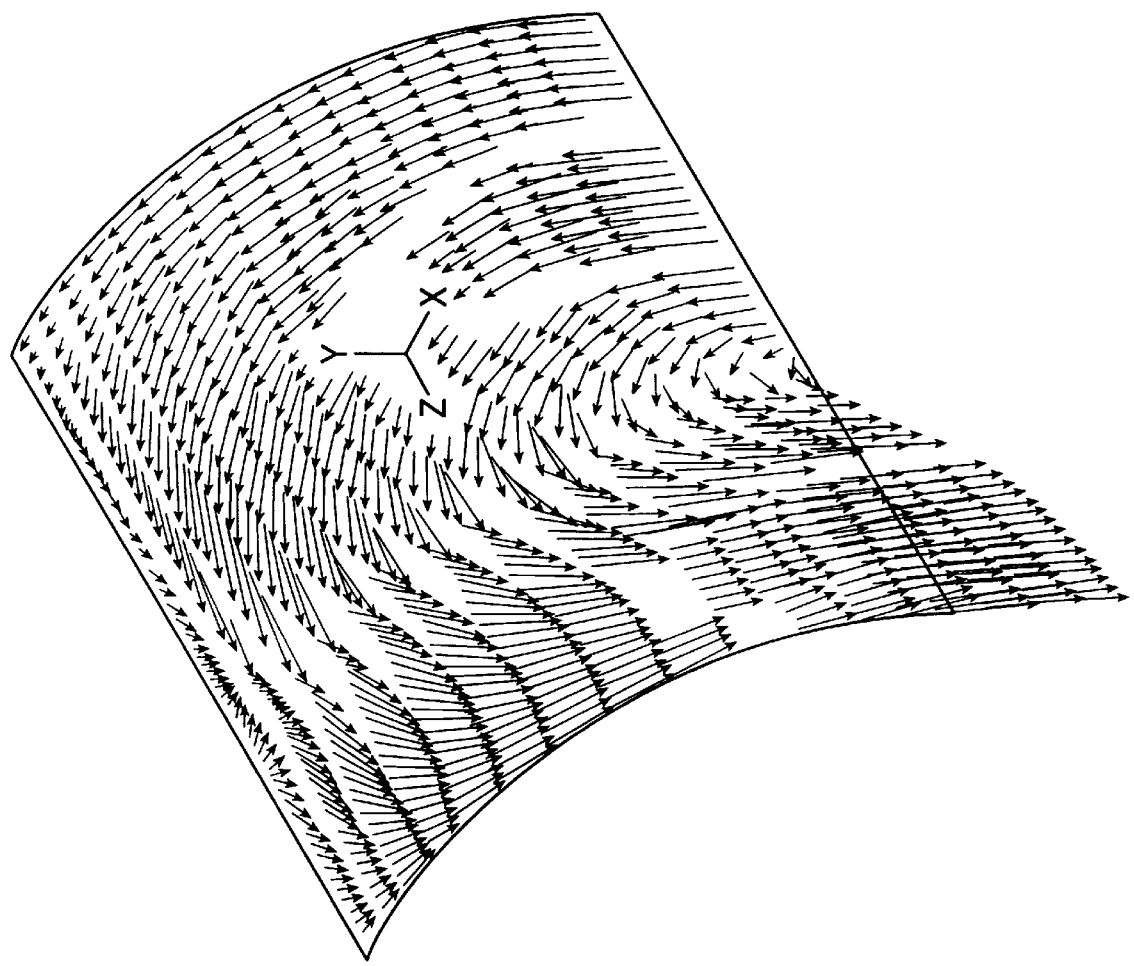
FIG. 4 is a vector plot of the current distribution of the portion of the primary coil modeled in FIG. 3 designed in accordance with the present invention.
Figure 5:
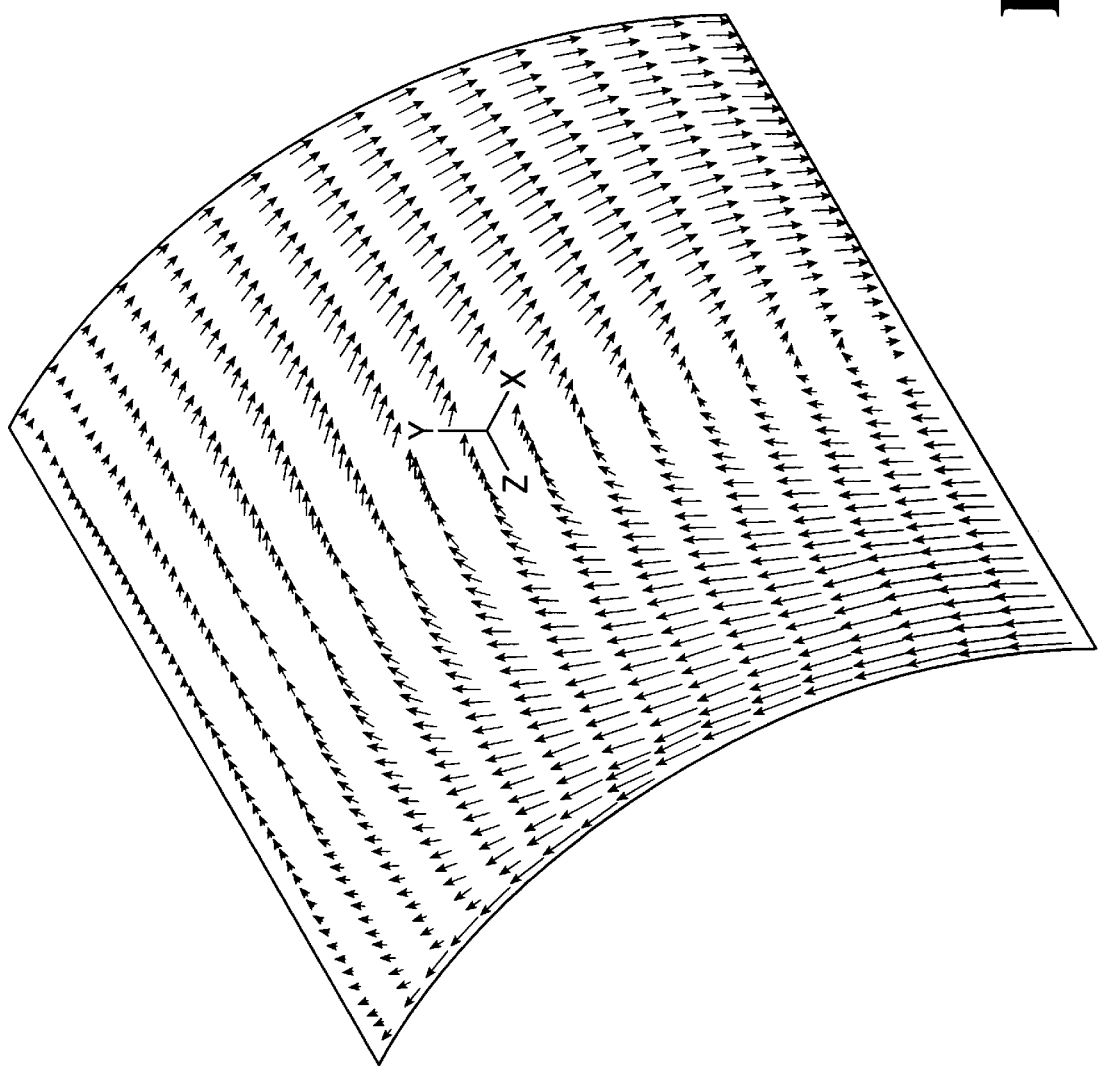
FIG. 5 is a vector plot of the current distribution of the portion of the shielding coil modeled in FIG. 3 designed in accordance with the present invention.
Figure 6:
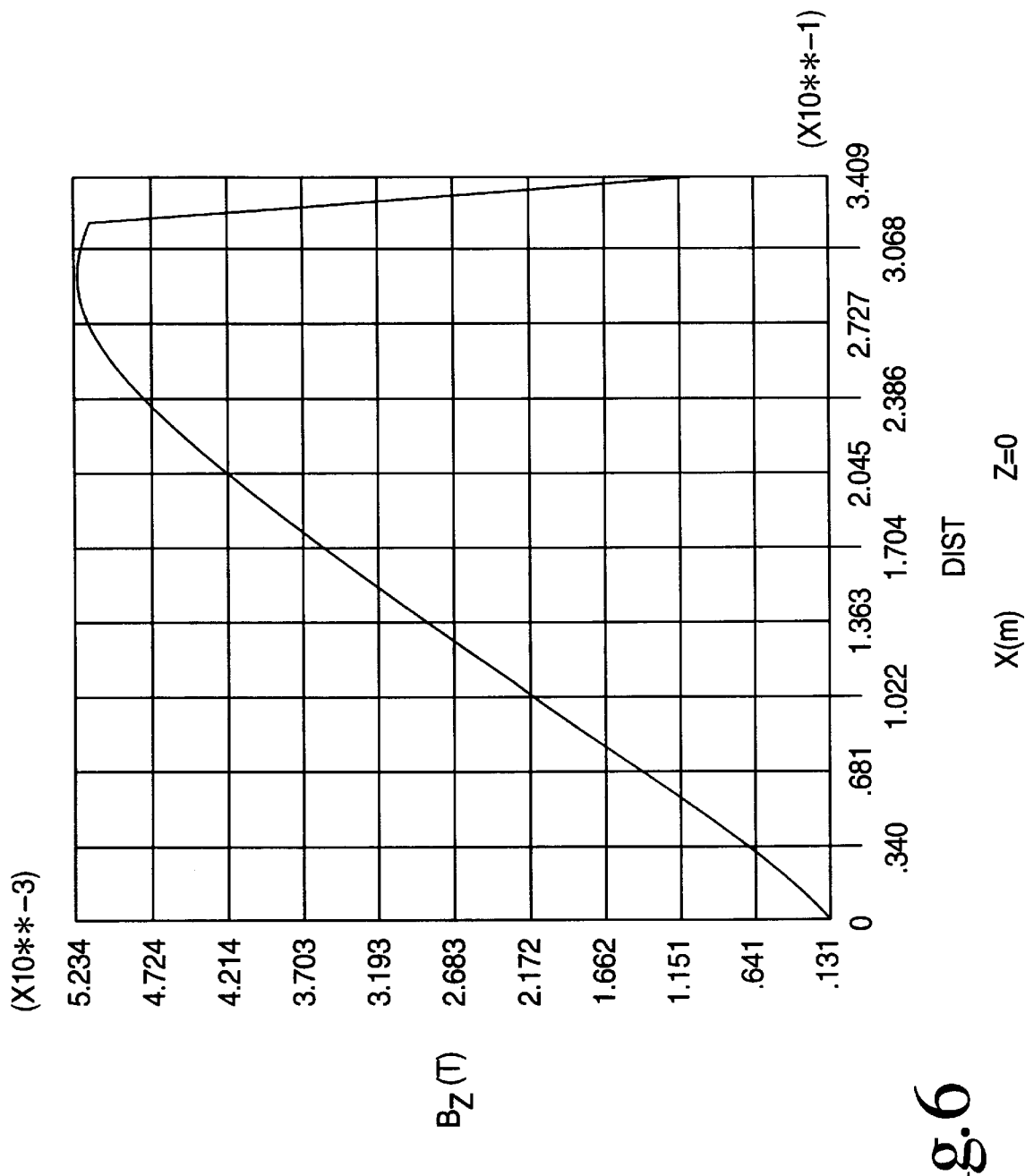
FIG. 6 is a plot of the z component of the gradient magnetic field in Tesla versus distance along the x axis in meters in the region inside the primary coil at an axial position z=0 m produce by the gradient coil assembly modeled in FIG. 3 design in accordance with the present invention.
Figure 7:
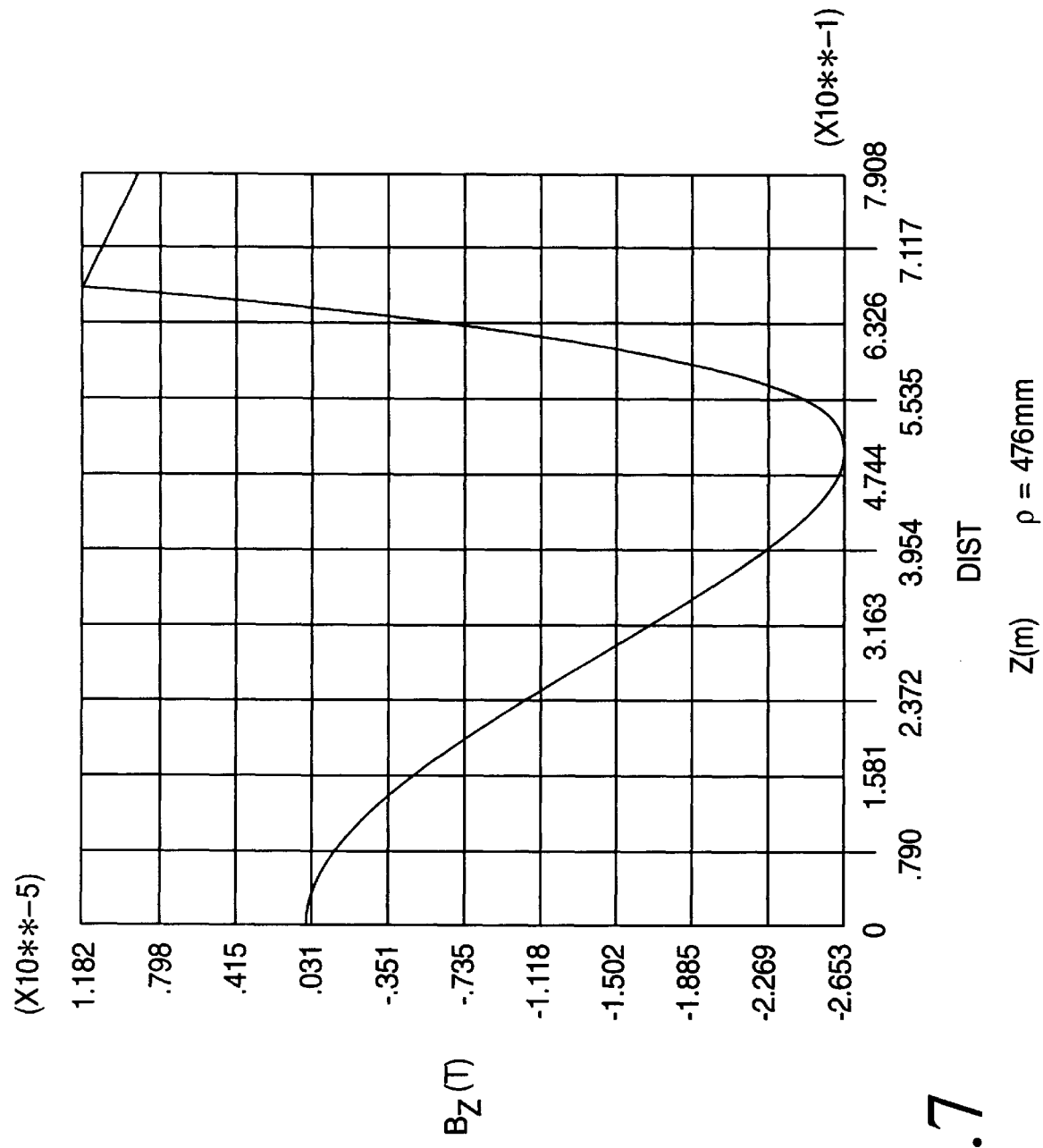
FIG. 7 is a plot of the z component of the fringe gradient magnetic field in Tesla versus distance along the z axis in meters at a radial position ρ=0.476 m produce by the gradient coil assembly modeled in FIG. 3 design in accordance with the present invention; and, FIG. 8 is a plot of the z component of the fringe gradient magnetic field in Tesla versus distance along the z axis in meters at a radial position ρ=0.476 m produce by a shielded gradient coil assembly designed with a truncated infinitely extended shielding current.

The secondary coil has an inner radius of 0.432354 m and an outer radius of 0.433354 m while its half length, $$\frac{L_b}{2},$$

is 0.663504 m. In this embodiment, the half length of both the primary and secondary coils are chosen to be substantially identical. However, the finite element analysis code has been set in a parametric way which permits changes to the dimensions of the primary and secondary coils to fit within desired design parameters. Given the dimensions of the layer that corresponds to the primary coil 60, the current load using the Fourier coefficient expansion as it was previously derived is applied thereto. FIG. 4 illustrates the current pattern behavior for the primary coil 60. To find the appropriate current pattern which will shield the primary coil's magnetic field and will flow within the boundaries of the secondary coil's layer, the finite element problem is approached as an eddy current problem. The material for the shielding coil's layer is taken to be copper with a resistivity of $1.76 \times 10^{-8}$ $\Omega$-m at 25° C. Performing a harmonic analysis with a frequency of 0.1 MHZ, the solution for the current pattern of the shielding coil is obtained as shown in FIG. 5. Note, the high frequency is chosen in order to avoid skin depth effects. In this manner, the shielding coil 62 is designed such that the fringe magnetic field generated by the primary coil 60 is substantially canceled in a region outside the area defined by the secondary coil 62. Next, the z component of the magnetic field along the gradient x direction is evaluated inside the region defined by the primary coil 60 to ensure the quality of the gradient magnetic field. FIG. 6 plots the resulting total gradient (including the shielding coil's contribution) generated as the z component of the gradient magnetic field versus the distance along the x axis in the region inside the primary coil 60. The resulting total gradient strength is calculated to be 20.3 mT/m with a 6.8% linearity at a radial location of 0.2386 m from the isocenter of the coil. With reference to FIG. 7, the shielding behavior of the shielded gradient coil assembly 22 is evaluated at the region outside the shielding coil and at a radial location of $\rho=0.476$ m. As FIG. 7 illustrates, the net fringe magnetic field near the isocenter is very favorable, approximately 0.3 $\mu$T. Its maximum, also very favorable, occurs at an axial location of 0.66 m from the coil's isocenter and has a value of approximately 12 $\mu$T.

Figure 8:
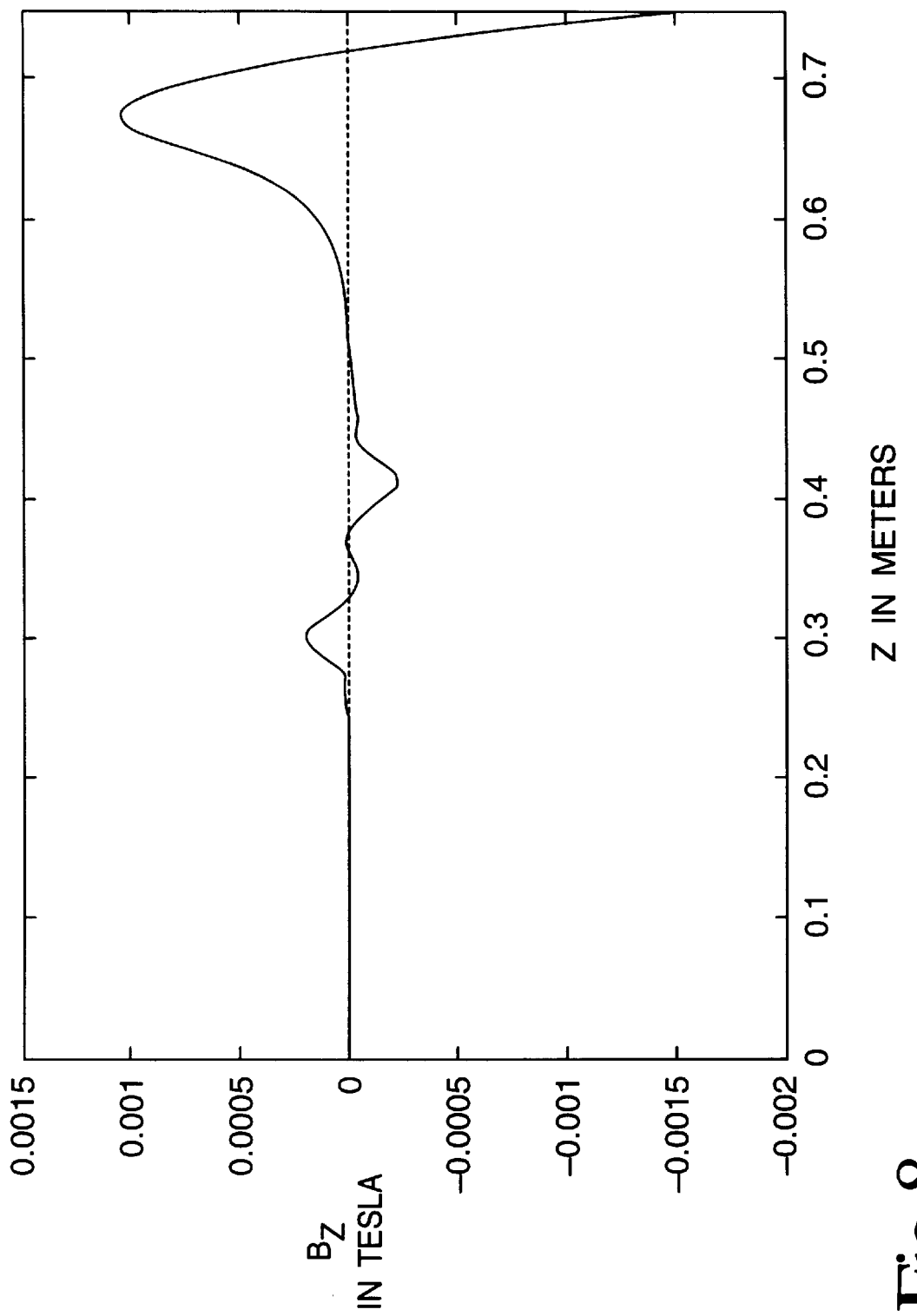

With reference to FIG. 8, an evaluation of the fringe magnetic field outside the shielding coil for a conventionally designed shielding coil having a truncated infinite shield current as previously described is illustrated. The shielding coil in this case is similar to the one designed using the finite element analysis previously described but was designed with an infinitely extended current that was truncated to fit an axial half length of 0.8 m. At a radial location of $\rho=0.476$ m, the coil designed with the truncated infinitely extending current has a fringe magnetic field maximum of 1.05 mT which occurs at an axial distance of 0.68 m from the isocenter of the coil. In comparison, the employment of the hybrid technique combining the inverse method and finite element analysis as described herein as opposed to the employment of the conventional truncation of an infinitely extended shielding current results in a reduction of the gradient coil's total fringe magnetic field by a factor of approximately 100.

The design of the y-gradient shielded gradient coil assembly receives the identical treatment as that of the x-gradient coil merely rotated 90° about a central axis. Similarly, the z-gradient coil receives a like treatment with slight variation. Further, while the shielded gradient coil assembly herein has been described with reference to particular geometric boundaries and parameters, it is to be appreciated that various sizes, lengths, and geometric configurations of shielded gradient coil assemblies may be designed to meet the constraints of numerous applications. For example, the specified current patterns can be changed to produce either better linearity at the price of coil efficiency or greater efficiency at the price of linearity. The dimensions of the cylindrical gradient coil can be changed to be larger or smaller according to preferred applications. Another alternate embodiment includes the design of shielding coils where the length of the shielding coil is smaller than the length of the primary coil. As well, the gradient coil assembly may be designed such that net thrust forces generated as a result of the interaction of non-uniformities in the main magnetic field and currents flowing through the gradient coil assembly are balanced for each primary and shielding coil set. Furthermore, it is to be appreciated that while described with reference to magnetic resonance imaging systems having central bore examination regions, the design technique is also applicable to open type magnetic resonance imaging apparatus having axial and/or vertically directed fields.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims and/or equivalents thereof.

Having thus described the preferred embodiments, the invention is now claimed to be:

1. A method of designing shielded gradient coil assemblies for magnetic resonance imaging systems comprising:
    (a) generating a first continuous current distribution for a primary coil using an inverse approach such that the first continuous current distribution is confined within predetermined finite geometric boundaries of a surface defined by two dimensions and generates a magnetic gradient field across an imaging region, the magnetic gradient field constrained to predetermined values at specified spatial locations within the imaging region; and,
    (b) generating a second continuous current distribution for a shielding coil using finite element analysis such that the second continuous current distribution is confined within predetermined finite geometric boundaries of a surface surrounding the primary coil, such that the second continuous current distribution generates a magnetic field which substantially cancels in an area outside a region defined by the shielding coil a fringe magnetic field generated by the first continuous current distribution;
    wherein the predetermined finite geometric boundaries for the first and second continuous current distributions have finite lengths.

2. The method according to claim 1, wherein the primary coil is cylindrical and the two dimensions that define it are axial position along a length of the cylinder and annular rotation about a circumference of the cylinder.

3. The method according to claim 2, wherein the shielding coil is cylindrical and has a length substantially equal to or less than that of the primary coil.

4. A method of designing shielded gradient coil assemblies for magnetic resonance imaging systems comprising:
 (a) generating a first continuous current distribution for a primary coil using an inverse approach such that the first continuous current distribution is confined within predetermined finite geometric boundaries of a surface defined by two dimensions and generates a magnetic gradient field across an imaging region, the magnetic gradient field constrained to predetermined values at specified spatial locations within the imaging region; and,
 (b) generating a second continuous current distribution for a shielding coil using finite element analysis such that the second continuous current distribution is confined within predetermined finite geometric boundaries of a surface surrounding the primary coil, such that the second continuous current distribution generates a magnetic field which substantially cancels in an area outside a region defined by the shielding coil a fringe magnetic field generated by the first continuous current distribution;
 wherein the shielding coil is made of a conductive material and a harmonic analysis at high frequency is performed to obtain the second continuous current distribution.

5. A method of designing shielded gradient coil assemblies for magnetic resonance imaging systems comprising:
 (a) generating a first continuous current distribution for a primary coil using an inverse approach such that the first continuous current distribution is confined within predetermined finite geometric boundaries of a surface defined by two dimensions and generates a magnetic gradient field across an imaging region, the magnetic gradient field constrained to predetermined values at specified spatial locations within the imaging region;
 (b) discretizing the first continuous current distribution to obtain a discrete current pattern;
 (c) applying the Biot-Savart law to the discrete current pattern to verify its validity; and,
 (d) generating a second continuous current distribution for a shielding coil using finite element analysis such that the second continuous current distribution is confined within predetermined finite geometric boundaries of a surface surrounding the primary coil, such that the second continuous current distribution generates a magnetic field which substantially cancels in an area outside a region defined by the shielding coil a fringe magnetic field generated by the first continuous current distribution.

6. A method of designing shielded gradient coil assemblies for magnetic resonance imaging systems comprising:
 (a) generating a first continuous current distribution for a primary coil using an inverse approach such that the first continuous current distribution is confined within predetermined finite geometric boundaries of a surface defined by two dimensions and generates a magnetic gradient field across an imaging region, the magnetic gradient field constrained to predetermined values at specified spatial locations within the imaging region; and,
 (b) generating a second continuous current distribution for a shielding coil using finite element analysis such that the second continuous current distribution is confined within predetermined finite geometric boundaries of a surface surrounding the primary coil, such that the second continuous current distribution generates a magnetic field which substantially cancels in an area outside a region defined by the shielding coil a fringe magnetic field generated by the first continuous current distribution;
 wherein a maximum of the fringe magnetic field in the area outside the region defined by the shielding coil is less than 50 $\mu$T.

7. A method of designing a shielded gradient coil assembly having an inner, primary cylindrical winding and an outer, shield cylindrical winding both of finite length, the method comprising:
 a) defining a first target magnetic field distribution within the primary cylindrical winding;
 b) generating a first continuous current distribution for lying on a cylinder having a length and diameter of the primary cylindrical winding;
 c) performing a finite element analysis using as a load the first continuous current distribution of the primary cylindrical winding and via eddy current analysis obtain a second continuous current distribution lying on a shield cylinder having the length and diameter of the shield cylindrical windings;
 d) discretizing the first and second continuous current distributions;
 e) creating cylindrical primary and shield windings with the discretized first and second current distributions.

8. The method as set forth in claim 7 wherein the first target magnetic field is a linear magnetic field gradient.

9. The method as set forth in claim 7 wherein the primary and shield cylinders have a common length.

10. The method as set forth in claim 7 wherein the primary and shield cylinders are circularly symmetric.

11. A shielded coil assembly designed by the method of claim 7.

12. A magnetic resonance scanner comprising:
 a main magnet for generating a main magnetic field through an examination region, the main magnet being arranged such that its geometry defines the examination region;
 a couch which supports a subject to be examined within the examination region;
 a radio frequency coil disposed adjacent the examination region for transmitting radio frequency signals into the examination region and selectively exciting dipoles disposed therein;
 a radio frequency transmitter for driving the radio frequency coil;
 a receiver which receives magnetic resonance signals from resonating dipoles within the examination region;
 an image processor which reconstructs an image representation from the received magnetic resonance signals for display on a human readable display; and,
 a gradient coil assembly for generating substantially linear magnetic gradients across the main magnetic field, the gradient coil assembly including;
  at least one primary coil assembly disposed about the examination region including an array of conductive coil loops arranged on a finite former such that a current density flowing thereon generates the substantially linear magnetic gradients; and,
  at least one secondary coil assembly disposed about the primary coil assembly between the primary coil assembly and the main magnet including an array of conductive coil loops arranged on a finite former such that a current density flowing thereon substantially cancels magnet flux density outside an area defined by the secondary coil assembly;

wherein the current density of the secondary coil assembly is arranged to counter eddy currents that would be generated in the secondary coil assembly by the primary coil assembly; and, wherein the formers are hollow cylindrical tubes arranged such that the examination region is defined inside the former of the primary coil assembly with the former of the primary coil assembly positioned inside the former of the secondary coil assembly and an axial length of the secondary coil assembly is substantially equal to or less than that of the primary coil assembly.

13. The magnetic resonance scanner according to claim 12, wherein a maximum magnetic flux density outside the area defined by the secondary coil assembly is less than 50 $\mu T$.

14. The magnetic resonance scanner according to claim 12, wherein the current density at axial ends of the cylindrical secondary coil assembly is greater than at its center.

15. A magnetic resonance scanner comprising:

a main magnet for generating a main magnetic field through an examination region, the main magnet being arranged such that its geometry defines the examination region;

a couch which supports a subject to be examined within the examination region;

a radio frequency coil disposed adjacent the examination region for transmitting radio frequency signals into the examination region and selectively exciting dipoles disposed therein;

a radio frequency transmitter for driving the radio frequency coil;

a receiver which receives magnetic resonance signals from resonating dipoles within the examination region;

an image processor which reconstructs an image representation from the received magnetic resonance signals for display on a human readable display; and, a gradient coil assembly for generating substantially linear magnetic gradients across the main magnetic field, the gradient coil assembly including;

at least one primary coil assembly disposed about the examination region including an array of conductive coil loops arranged on a finite former such that a current density flowing thereon generates the substantially linear magnetic gradients; and, at least one secondary coil assembly disposed about the primary coil assembly between the primary coil assembly and the main magnet including an array of conductive coil loops arranged on a finite former such that a current density flowing thereon substantially cancels magnet flux density outside an area defined by the secondary coil assembly;

wherein the current density of the secondary coil assembly is arranged to counter eddy currents that would be generated in the secondary coil assembly by the primary coil assembly; and, wherein the gradient coil assembly includes three primary coil assembly and secondary coil assembly pairs for generating substantially linear magnetic gradients along three mutually orthogonal axes.

16. A shielded coil assembly designed by the method of claim 1.

* * * * *